(12) United States Patent
Tsuda

(10) Patent No.: US 8,471,653 B2
(45) Date of Patent: Jun. 25, 2013

(54) ELASTIC WAVE RESONATOR AND LADDER FILTER

(75) Inventor: Motoji Tsuda, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 13/605,066

(22) Filed: Sep. 6, 2012

(65) Prior Publication Data

US 2012/0326809 A1      Dec. 27, 2012

Related U.S. Application Data

(63) Continuation of application No. PCT/JP2011/055511, filed on Mar. 9, 2011.

(30) Foreign Application Priority Data

Mar. 12, 2010  (JP) .................................. 2010-056469

(51) Int. Cl.
*H03H 9/64* (2006.01)
*H03H 9/145* (2006.01)
*H03H 9/15* (2006.01)

(52) U.S. Cl.
USPC ....................................... 333/196; 310/313 C

(58) Field of Classification Search
USPC ....................................... 333/196; 310/313 C
See application file for complete search history.

(56) References Cited

U.S. PATENT DOCUMENTS

| | | | |
|---|---|---|---|
| 6,310,422 B1 * | 10/2001 | Satoh et al. ............... | 310/313 R |
| 7,940,146 B2 * | 5/2011 | Oda ............................. | 333/193 |
| 7,994,878 B2 * | 8/2011 | Isobe et al. ................. | 333/195 |
| 8,354,896 B2 * | 1/2013 | Matsuda et al. ........... | 333/193 |
| 2007/0046394 A1 | 3/2007 | Inoue et al. | |
| 2008/0309192 A1 | 12/2008 | Nakao et al. | |
| 2010/0176900 A1 | 7/2010 | Tanaka | |

FOREIGN PATENT DOCUMENTS

| | | | |
|---|---|---|---|
| JP | 2645674 B2 | | 8/1997 |
| JP | 10-41778 A | | 2/1998 |
| JP | 2003-101374 A | | 4/2003 |
| JP | 2006-14096 | * | 1/2006 |
| JP | 2007-60412 A | | 3/2007 |
| JP | 2007-68231 | * | 3/2007 |
| JP | 2007-116628 | * | 5/2007 |
| JP | 2009-219045 A | | 9/2009 |
| WO | 2007/108269 A1 | | 9/2007 |
| WO | 2009/050932 A1 | | 4/2009 |

OTHER PUBLICATIONS

Official Communication issued in International Patent Application No. PCT/JP2011/055511, mailed on May 24, 2011.

* cited by examiner

*Primary Examiner* — Barbara Summons
(74) *Attorney, Agent, or Firm* — Keating & Bennett, LLP

(57) ABSTRACT

To enhance a heat dissipation property and achieve stabilization of a resonance characteristic in an elastic wave resonator including an IDT electrode weighted so as to have a plurality of apodization local maximum value portions, the elastic wave resonator includes an IDT electrode located on a piezoelectric substrate, the IDT electrode is apodization-weighted so that a plurality of local maximum values occur in apodization in an elastic wave propagation direction, heat dissipation electrodes are provided in at least one apodization local minimum value portion occurring in the elastic wave propagation direction in the IDT electrode, and when it is assumed that direction dimension widths of the heat dissipation electrodes in the elastic wave propagation direction are A and the dimension of about ½ of a wave length of a propagating elastic wave is B, B<A is satisfied.

8 Claims, 5 Drawing Sheets

ELASTIC WAVE RESONATOR AND LADDER FILTER

BACKGROUND OF THE INVENTION

1. Field of the Invention

The present invention relates to an elastic wave resonator such as a surface acoustic wave resonator or a boundary acoustic wave resonator. In more detail, the present invention relates to an elastic wave resonator including an IDT electrode, subjected to apodization weighting so that a plurality of local maximum values of apodization (i.e., crossing width), occur in an elastic wave propagation direction, and a ladder filter including the elastic wave resonator.

2. Description of the Related Art

In the past, various types of elastic wave resonators have been proposed that utilize a surface acoustic wave or a boundary acoustic wave. For example, in Japanese Patent No. 2645674, a configuration is disclosed where, in an IDT electrode, apodization weighting is performed so that apodization becomes large in a surface acoustic wave propagation direction central portion and the apodization decreases toward an end portion in a surface acoustic wave propagation direction. It is supposed that, owing to this configuration, a spurious response due to transverse modes is suppressed. However, since the apodization becomes large in the central portion of the IDT electrode, maximum apodization becomes large. More specifically, there has occurred a problem that electric power consumption is concentrated in the corresponding IDT electrode central portion and power durability is deteriorated. In addition to this, there has also occurred a problem that since the maximum apodization is large, the size of the surface acoustic wave resonator is increased.

Therefore, in WO 2007/108269, an elastic wave resonator is disclosed that is subjected to apodization weighting so that more than one local maximum value exists in an elastic wave propagation direction. FIG. 9 is a schematic plan view illustrating the electrode structure of the elastic wave resonator described in WO 2007/108269.

In an elastic wave resonator 1001, the illustrated electrode structure is formed on a piezoelectric substrate. This electrode structure includes an IDT electrode 1002 and reflectors 1003 and 1004 disposed on both sides in the elastic wave propagation direction of the IDT electrode 1002. The IDT electrode 1002 is apodization-weighted. More specifically, apodization changes in the elastic wave propagation direction. Here, the apodization weighting is performed so that two apodization local maximum values exist in the elastic wave propagation direction. A region where electrodes connected to different electric potentials overlap each other in the elastic wave propagation direction is a region surrounded by envelope curves A and B in FIG. 9. As is clear from FIG. 9, two portions exist where the apodization becomes a local maximum in the elastic wave propagation direction. Therefore, between two portions E and F where the apodization becomes a local maximum, a portion G exists where the apodization becomes a local minimum.

In the elastic wave resonator described in WO 2007/108269, since the IDT electrode is apodization-weighted in such a way as described above, it is possible to suppress an influence of a spurious response due to transverse modes, and it is possible to reduce the maximum apodization of the IDT electrode. As a result, it is possible to improve power durability. In addition, it is also possible to reduce the size of the elastic wave resonator.

However, there was understood to occur a problem that a heat dissipation property is insufficient. More specifically, when high-frequency power is applied to the elastic wave resonator 1001, the amount of heat generation becomes largest in the portions E and F where the apodization becomes a local maximum. However, it is possible to dissipate heat generated in the portions, by integrating one busbar 1002a of the IDT electrode 1002, connected to a ground potential, with the busbars of the reflectors 1003 and 1004. More specifically, since the portions E and F where the apodization becomes a local maximum are relatively close to the reflectors 1003 and 1004, it is possible to release heat to the reflectors 1003 and 1004 sides.

On the other hand, the portion G where the apodization becomes a local minimum value is located away from the reflectors 1003 and 1004. Accordingly, in the portion G where the apodization becomes a local minimum, while the amount of heat generation is smaller than the portions E and F, it is easy for heat to be accumulated. Accordingly, there has occurred a problem that it is difficult to achieve sufficient dissipation of heat of the elastic wave resonator.

In addition, when a heat dissipation property in the IDT electrode 1002 has been insufficient, it has been likely that a resonance characteristic has deviated from an original resonance characteristic owing to a temperature change.

SUMMARY OF THE INVENTION

Preferred embodiments of the present invention provide an elastic wave resonator including an IDT electrode subjected to apodization weighting so as to reduce an influence of spurious due to transverse modes, wherein it is possible to enhance a heat dissipation property of the IDT electrode so as to obtain a stable resonance characteristic. In addition, preferred embodiments of the present invention enhance a heat dissipation property of an IDT electrode of an elastic wave resonator, thereby providing a ladder filter that is superior in heat dissipation property and has a stable filter characteristic.

An elastic wave resonator according to a preferred embodiment of the present invention includes a piezoelectric substrate, and an IDT electrode provided on the piezoelectric substrate. The IDT electrode is apodization-weighted so that a plurality of local maximum values in apodization occur in an elastic wave propagation direction. In a preferred embodiment of the present invention, a heat dissipation electrode is further included that is configured to be provided in at least one apodization local minimum value portion from among portions of one or more apodization local minimum values that occur in the elastic wave propagation direction and are sandwiched between portions of the plural apodization local maximum values occurring, in the IDT electrode, and when it is assumed that a direction dimension width of the heat dissipation electrode in the elastic wave propagation direction is A and the dimension of about ½ of a wave length of a propagating elastic wave is B, B<A is satisfied. It is more preferable that about 2.5 B≦A is satisfied, and accordingly, it is possible to further enhance a heat dissipation property.

It is preferable that, in the elastic wave resonator according to a preferred embodiment of the present invention, the above-mentioned heat dissipation electrode is provided in each of the one or more apodization local minimum value portions. Accordingly, it is possible to further enhance the heat dissipation property.

In another preferred embodiment of the elastic wave resonator according to the present invention, the above-mentioned heat dissipation electrode preferably extends in a direction perpendicular or substantially perpendicular to an elastic wave propagation direction and includes first and second heat dissipation electrodes facing each other across a gap in a direction perpendicular or substantially perpendicular to the elastic wave propagation direction. In this case, the lengths of the first and second heat dissipation electrodes may be equal to each other. When the lengths of the first and second heat dissipation electrodes are equal to each other, it is possible to cause the first and second heat dissipation electrodes to evenly dissipate heat via the first heat dissipation electrode and the second heat dissipation electrode.

In addition, the lengths of the first and second heat dissipation electrodes may be different from each other. In that case, it is possible to cause a direction in which heat is dissipated to have directionality.

In the elastic wave resonator according to a preferred embodiment of the present invention, it is preferable that the area of the heat dissipation electrode is larger than the area of a remaining electrode finger. In this case, it is possible to further enhance the heat dissipation property.

In the elastic wave resonator according to a preferred embodiment of the present invention, it is preferable that the IDT electrode includes a pair of busbars, and one busbar of the IDT electrode is integrated with reflectors disposed on both sides of the IDT electrode in the elastic wave propagation direction.

A ladder filter according to a preferred embodiment of the present invention includes a series arm resonator and a parallel arm resonator configured to include elastic wave resonators, wherein at least one elastic wave resonator from among the elastic wave resonators included in the series arm resonator and the parallel arm resonator includes an elastic wave resonator configured according to a preferred embodiment of the present invention. Accordingly, since a heat dissipation property in the IDT electrode of the elastic wave resonator is enhanced, it is possible to enhance the heat dissipation property of the ladder filter. Therefore, it is possible to obtain stable filter characteristics.

Since, in an elastic wave resonator according to a preferred embodiment of the present invention, apodization weighting is performed so that a plurality of apodization local maximum values occur in an elastic wave propagation direction, it is possible to suppress an influence due to transverse modes. Furthermore, owing to a heat dissipation electrode, it is possible to swiftly dissipate heat generated in an apodization local minimum value portion. Accordingly, for example, even if an IDT electrode generates heat owing to application of high-frequency power, it is possible to enhance a heat dissipation property. Accordingly, it is possible to provide an elastic wave resonator whose resonance characteristic is stable.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, the present invention will be clarified by describing preferred embodiments thereof with reference to drawings.

Figure 1A:
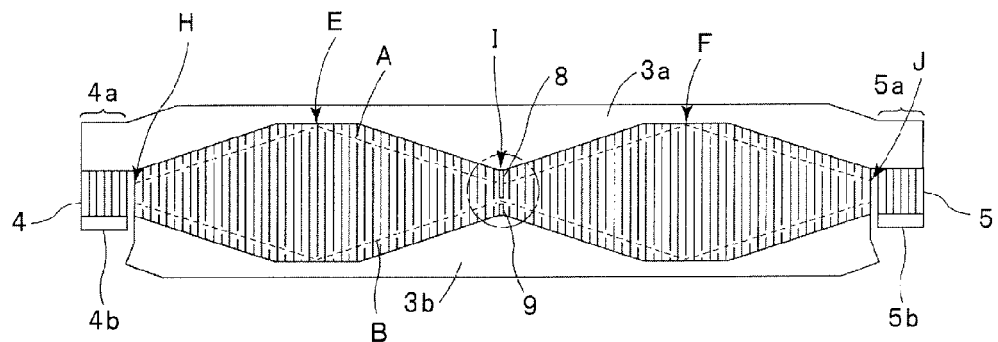
FIG. 1A is a schematic plan view illustrating an electrode structure of an elastic wave resonator according to a first preferred embodiment of the present invention.
Figure 1B:
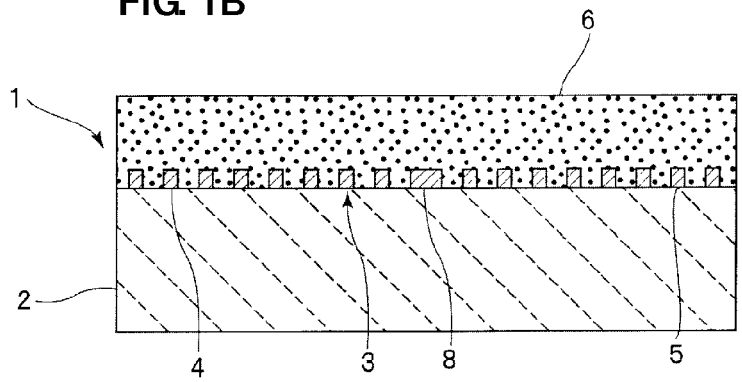
FIG. 1B is a schematic elevational cross-sectional view of the elastic wave resonator.

FIGS. 1A and 1B are a schematic plan view illustrating the electrode structure of an elastic wave resonator according to a preferred embodiment of the present invention and a schematic elevational cross-sectional view of the elastic wave resonator.

An elastic wave resonator 1 preferably is a surface acoustic wave resonator utilizing a surface acoustic wave. The elastic wave resonator 1 of the present preferred embodiment obtains a resonance characteristic preferably using a Rayleigh wave. However, in the present invention, an elastic wave other than a leaky elastic wave may be used, and a Love wave may be used without being limited only to the Rayleigh wave. The elastic wave resonator 1 includes a piezoelectric substrate 2. In the present preferred embodiment, the piezoelectric substrate 2 is preferably made of lithium niobate, for example. However, the piezoelectric substrate 2 may also be made of other piezoelectric single crystal such as potassium niobate, lithium tantalate, quartz crystal, diamond, langasite, or lithium tetraborate, for example. In addition, the piezoelectric substrate 2 may also be made of piezoelectric ceramics, for example. In addition, the piezoelectric substrate 2 may also include a structure where a piezoelectric thin film is laminated in an insulator.

An IDT electrode 3 is located on the piezoelectric substrate 2. Reflectors 4 and 5 are disposed on both sides of the IDT electrode 3 in the surface acoustic wave propagation direction.

As illustrated in FIG. 1B, in the present preferred embodiment, an insulation film 6 is provided so as to improve a frequency temperature characteristic. The insulation film 6 is arranged to coat the IDT electrode 3 and the reflectors 4 and 5. In the preset preferred embodiment, the insulation film 6 is preferably made of silicon oxide, for example. However, while not limited only to silicon oxide, the insulation film 6 may be made of using various dielectric materials such as silicon nitride, silicon oxynitride, silicon carbide, titanium oxide, titanium nitride, or tantalum oxide, for example. In addition, the insulation film 6 may also be formed by laminating a plurality of layers made of these insulating materials.

The IDT electrode 3 and the reflectors 4 and 5 may made of an arbitrary metal or alloy, for example. In the present preferred embodiment, the IDT electrode 3 preferably has a structure in which a Pt film and an Al film are laminated. In addition, in the busbars 3a and 3b of the IDT electrode 3 and a lead wiring line (not illustrated), a resistance auxiliary film may also be further laminated on a laminated metal film formed by laminating the Pt film and the Al film. As the resistance auxiliary film, metal such as Al, Au, Ni, Ti, Cr, Pt, Cu, W, or Ag may preferably be used, for example. The resistance auxiliary film may also be formed by laminating a plurality of layers of metal films made of these metals, for example. In addition, the resistance auxiliary film may also be formed using alloy mainly including these metals, for example.

As illustrated in FIG. 1A, the IDT electrode 3 includes a pair of comb-shaped electrodes, and is apodization-weighted so that a plurality of local maximum values of apodization occur in the surface acoustic wave propagation direction. In other words, the IDT electrode 3 is apodization-weighted, and includes a first envelope curve A and a second envelope curve B on an outer side in a direction perpendicular or substantially perpendicular to the surface acoustic wave propagation direction. The envelope curve is a virtual line formed by linking leading ends of a plurality of electrode fingers connected to one electric potential, with one another.

In the elastic wave resonator 1 of the first preferred embodiment, a region surrounded by the envelope curves A and B is arranged so as to include two rhombic regions. The two rhombic regions are aligned with each other in the surface acoustic wave propagation direction. However, as illustrated in FIG. 1A, the apexes of the two rhombic regions are not linked to each other. More specifically, in portions indicated by arrows in FIG. 1A, namely, in the rhombic regions, apodization in end portions H, I, and J on both sides in the surface acoustic wave propagation direction does not become zero, and apodization weighting is performed so that the end portions have apodization corresponding to about 20% of maximum apodization, for example. It is only necessary for apodization in the end portions to be small enough to reduce transverse mode spurious. In addition, it is desirable that the apodization in the end portions is less than or equal to about 50% of the maximum apodization, and it is more desirable that the apodization in the end portions is less than or equal to about 25% of the maximum apodization, for example.

In addition, the reflectors 4 and 5 have structures where a plurality of electrode fingers extending in a direction perpendicular or substantially perpendicular to the surface acoustic wave propagation direction are short-circuited using busbars 4a, 4b, 5a, and 5b on both ends.

As described in WO 2007/108269, since the IDT electrode 3 is apodization-weighted as described above, it is possible to significantly reduce and prevent an influence due to transverse modes. Accordingly, it is possible to enhance the Q value of an anti-resonant frequency. In addition, it is possible to enhance power durability.

One of the unique features of the elastic wave resonator 1 of the present preferred embodiment is that, in the IDT electrode 3 subjected to apodization weighting as described above, in the apodization local minimum value portion I existing between the portions E and F indicating an apodization local maximum value, first and second heat dissipation electrodes 8 and 9 are provided. The first heat dissipation electrode 8 is connected to one busbar 3a of the IDT electrode 3. The second heat dissipation electrode 9 is connected to the other busbar 3b. In addition, the one busbar 3a is integrated with one busbar 4a of the reflector 4 and one busbar 5a of the reflector 5. Accordingly, the busbar 3a is connected to the ground potential. The busbar 3b is a busbar on a hot side, and the second heat dissipation electrode 9 is connected to the busbar 3b on the hot side. In addition, it is not necessary for the busbar 3a to be connected to the ground potential.

In the present preferred embodiment, when it is assumed that the dimension of each of the first and second heat dissipation electrodes 8 and 9 in the elastic wave propagation direction is a width A, the width A is preferably relatively thicker than the other electrode fingers of the IDT electrode. More specifically, when it is assumed that about ½ of the wave length of a propagating elastic wave is B, the width A of the heat dissipation electrode preferably satisfies B<A. Here, the dimension of about ½ of the wave length of the propagating elastic wave turns out to be about one half of an interval between the IDT electrode fingers, namely, a distance between electrode fingers adjacent to each other in IDT electrodes mutually inserted therebetween. Accordingly, when B<A is satisfied, the width A of the heat dissipation electrode is relatively larger than the widths of other electrode fingers. Therefore, the area of the heat dissipation electrode including the first and second heat dissipation electrodes is preferably set to an area larger than the area of another electrode finger. Accordingly, it is possible to swiftly dissipate heat generated in the apodization local minimum value portion G to the busbar 3a or the busbar 3b.

In addition, while, in the present preferred embodiment, the first and second heat dissipation electrodes 8 are 9 are preferably provided, only one of the first heat dissipation electrode 8 or the second heat dissipation electrode 9 may be provided.

In addition, in the present preferred embodiment, the heat dissipation electrode is configured preferably using the first and second heat dissipation electrodes 8 and 9. In this case, it is assumed that the area of the heat dissipation electrode is the total sum of the areas of the first and second heat dissipation electrodes. In addition, it is assumed that another electrode finger to be compared with the heat dissipation electrode is an arbitrary electrode finger connected to the busbar 3a or 3b.

It is more desirable that about $2.5 B \leqq A$ is satisfied, and in that case, it is possible to further enhance the heat dissipation property.

Figure 1C:
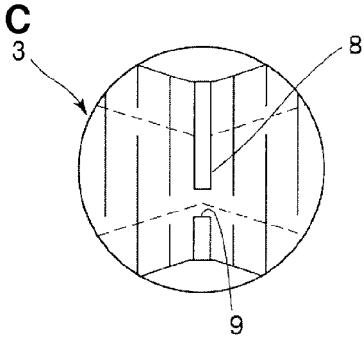
FIG. 1C is a magnification plan view for explaining an example of a modification.

As magnified and illustrated in FIG. 1C, the length of the first heat dissipation electrode 8 is different from the length of the second heat dissipation electrode 9. Accordingly, it is possible to effectively dissipate heat to the side of the first heat dissipation electrode 8 that is relatively long. Accordingly, it is possible to cause a dissipation direction to have directionality. In addition, since the busbar 3a to which the heat dissipation electrode 8 is connected is caused to extend to the busbars of the reflectors 4 and 5, it is possible to effectively dissipate heat generated in the IDT electrode 3.

In addition, in the present preferred embodiment, the first heat dissipation electrode 8 and the second heat dissipation electrode 9 may be equal in length to each other. In that case, it is possible to cause the first heat dissipation electrode 8 and the second heat dissipation electrode 9 to evenly dissipate generated heat. Accordingly, it is possible to reduce the bias of a heat generation distribution in the IDT electrode 3.

In addition, so as to secure a dissipation path to improve the heat dissipation property, it is only necessary for the corresponding heat dissipation electrode to extend to a metal body such as a busbar. For example, even if the heat dissipation electrode is connected to a metal pad such as an external connection terminal or a metal pattern such as a land, the advantageous effects and benefits of preferred embodiments of the present invention are obtained. In addition, as described above, if the corresponding heat dissipation electrode is connected to a ground electrode, the heat dissipation property is further improved.

Next, the advantageous effects and benefits of preferred embodiments of the present invention will be clarified on the basis of a specific non-limiting experimental example.

The IDT electrode 3 and the reflectors 4 and 5 were formed to include laminated metal films formed by laminating a Pt film and an Al film in this order on the piezoelectric substrate 2 made of lithium niobate. In addition, in the IDT electrode 3, in a portion other than electrode fingers, namely, in the busbars 3a and 3b, an Al film was further laminated as a resistance auxiliary film material. Thereafter, an $SiO_2$ film was laminated as the insulation film 6. The thicknesses of each metal film and the insulation film 6 are as follows.

The IDT electrode 3 and the reflectors 4 and 5: the thickness of the Al film=130 nm and the thickness of Pt film=about 30 nm The resistance auxiliary film: the thickness of the Al film=about 2000 nm The insulation film 6: the thickness of the $SiO_2$ film=about 600 nm As for the IDT electrode 3, an electrode finger pitch was set to about 950 nm, and as illustrated in FIG. 1A, apodization weighting was performed so that two apodization local maximum values exist in the elastic wave propagation direction. The width of an electrode finger other than the heat dissipation electrodes 8 and 9 in the IDT electrode 3 was set to about 475 nm.

The heat dissipation electrodes 8 and 9 were formed simultaneously with the IDT electrode 3 using a same material. The widths A of the heat dissipation electrodes 8 and 9=about 2375 nm was satisfied. In addition, the length of the first heat dissipation electrode 8 was set to about 12500 nm, and the length of the second heat dissipation electrode 9 was set to about 6200 nm.

Accordingly, the total sum S of the areas of the first and second heat dissipation electrodes 8 and 9 turns out to be approximately 44.4125 $\mu m^2$. On the other hand, from among the remaining electrode fingers, the area of an electrode finger whose area is the largest is the area of an electrode finger in an apodization local maximum value distribution, and corresponds to 475 nm in width×54000 nm in length=about 25.65 $\mu m^2$. Accordingly, the total sum S of the areas of the first and second heat dissipation electrodes 8 and 9 is larger than the area of the longest electrode finger.

For comparison, an elastic wave resonator of a comparative example was formed so as not to include the first and second heat dissipation electrodes 8 and 9 and an electrode finger whose width is the same as the remaining electrode fingers is formed in a portion in which the first and second heat dissipation electrodes 8 and 9 are to be provided, namely, the elastic wave resonator of a comparative example was formed in the same way as the above-mentioned preferred embodiment except that the widths of the first and second heat dissipation electrodes 8 and 9 are caused to be equal to the widths of the remaining electrode fingers.

Figure 8A:
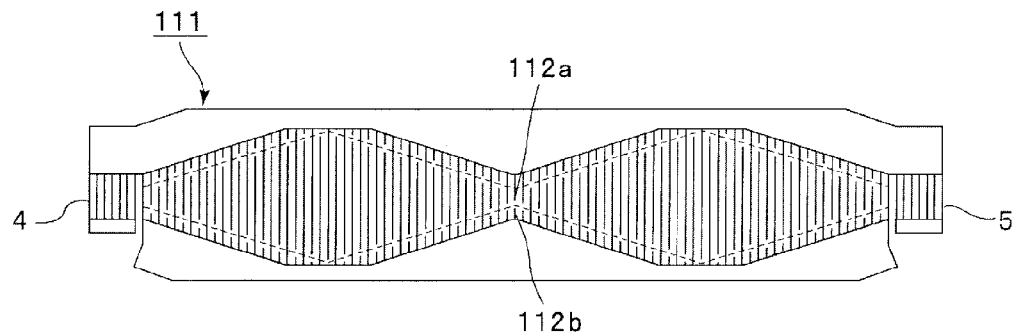
FIG. 8A is a schematic plan view of an elastic wave resonator prepared as a comparative example.

FIG. 8A is a schematic plan view illustrating the electrode structure of an elastic wave resonator 111 of a comparative example prepared in such a way. As illustrated in FIG. 8A, in place of the first and second heat dissipation electrodes 8 and 9, electrode fingers 112a and 112b are formed whose widths are equal to the widths of the remaining electrode fingers.

Figure 2:
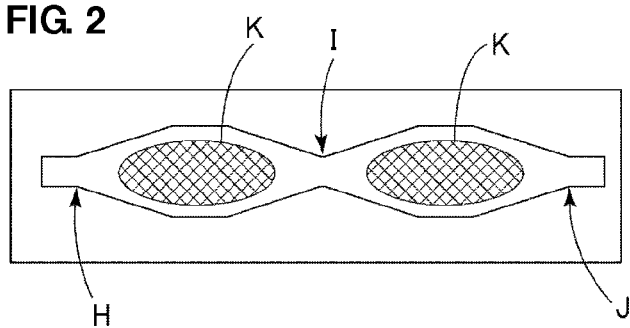
FIG. 2 is a plan view schematically illustrating a state of heat generation when high-frequency power is applied to the elastic wave resonator of the first preferred embodiment of the present invention.

A high-frequency power of about 0.8 W was applied to the non-limiting example of the present preferred embodiment and the elastic wave resonator 111 of the comparative example, prepared as described above, and heat generation distributions were measured using an infrared thermography. The heat generation distribution in the elastic wave resonator of the present preferred embodiment is illustrated in FIG. 2 as a schematic plan view. In FIG. 2, a region assigned with cross-hatching indicates a region in which a temperature is particularly high. It is understood that this region K spreads around the local maximum value portion of apodization and a temperature does not become so high in the apodization local minimum value portion I.

Figure 8B:
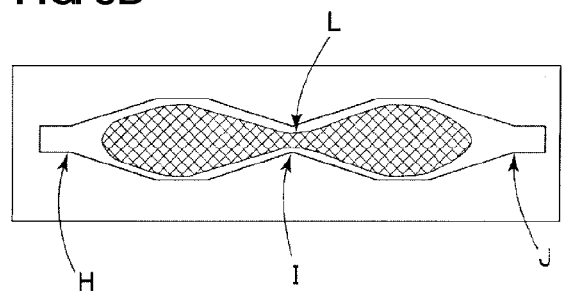
FIG. 8B is a plan view schematically illustrating a heat generation distribution in the elastic wave resonator of the comparative example.
Figure 9:
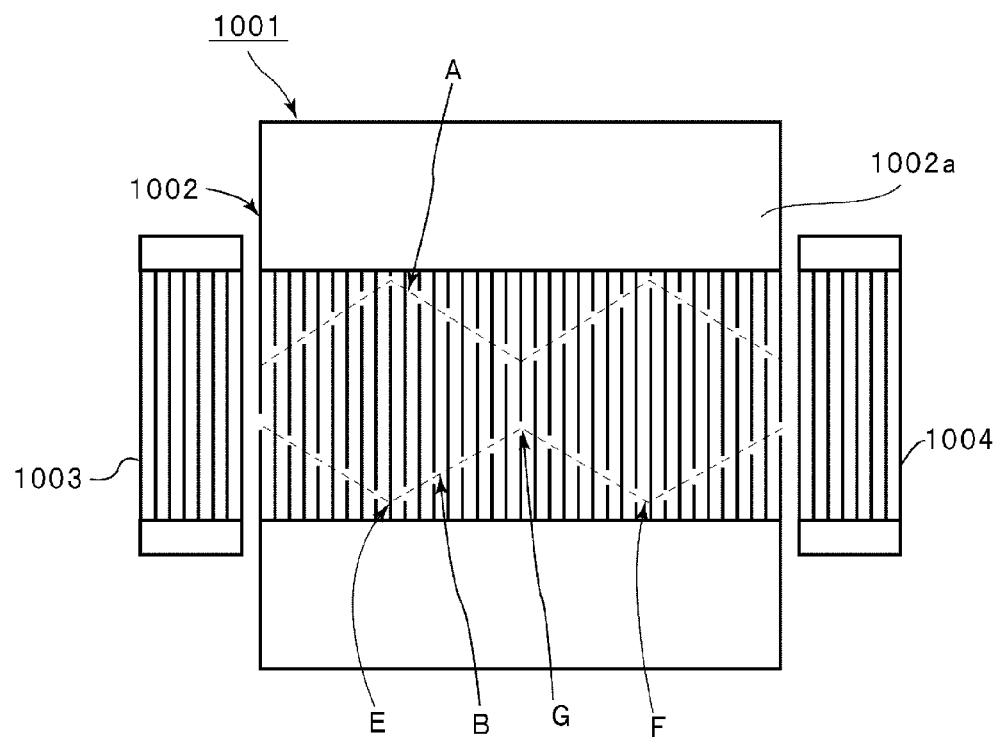
FIG. 9 is a schematic plan view illustrating an electrode structure of an elastic wave resonator of the related art.

On the other hand, as illustrated in FIG. 8B, it is understood that, in the heat generation distribution of the surface acoustic wave resonator of the comparative example, a high temperature portion indicated by an arrow L extends not only to the apodization local maximum value portions E and F but also to the apodization local minimum value portion I.

Accordingly, as is clear from comparison between FIG. 2 and FIG. 8B, according to the above-mentioned preferred embodiment, it is understood that, by providing the first and second heat dissipation electrodes 8 and 9, it may be possible to effectively dissipate heat generated in the apodization local minimum value portion.

As is clear from FIG. 2 and FIG. 8B, it is understood that, in a portion close to the reflectors 4 and 5, heat generated in the IDT electrode 3 is dissipated to the reflectors 4 and 5 sides and the high temperature portion does not extend to a portion adjacent to the reflectors 4 and 5 sides of the IDT electrode 3.

Figure 3:
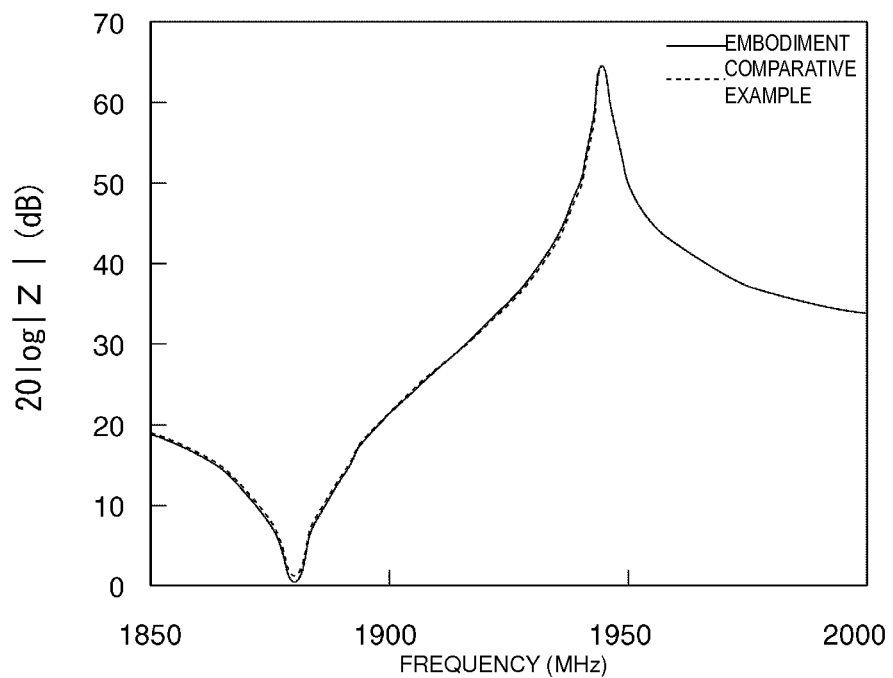
FIG. 3 is a diagram illustrating impedance frequency characteristics of elastic wave resonators of the first preferred embodiment of the present invention and a comparative example.
Figure 4:
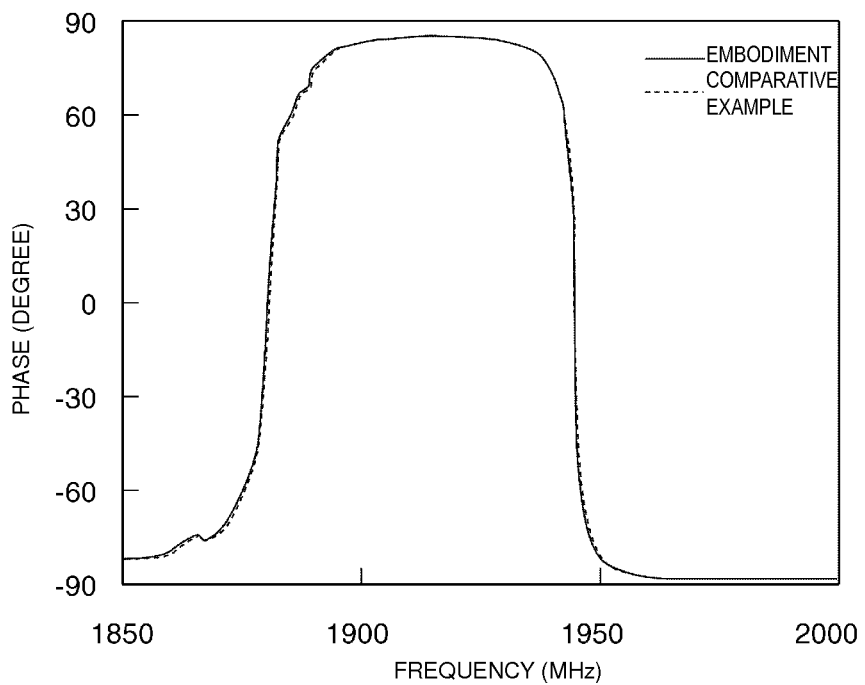
FIG. 4 is a diagram illustrating phase characteristics of the elastic wave resonators of the first preferred embodiment of the present invention and the comparative example.
Figure 5:
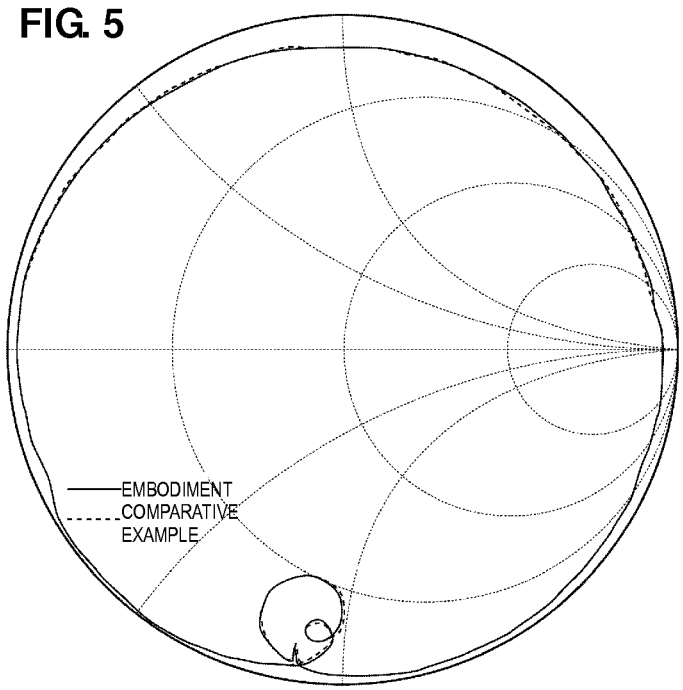
FIG. 5 is a Smith chart illustrating impedance characteristics of the elastic wave resonators of the first preferred embodiment of the present invention and the comparative example.
Figure 6:
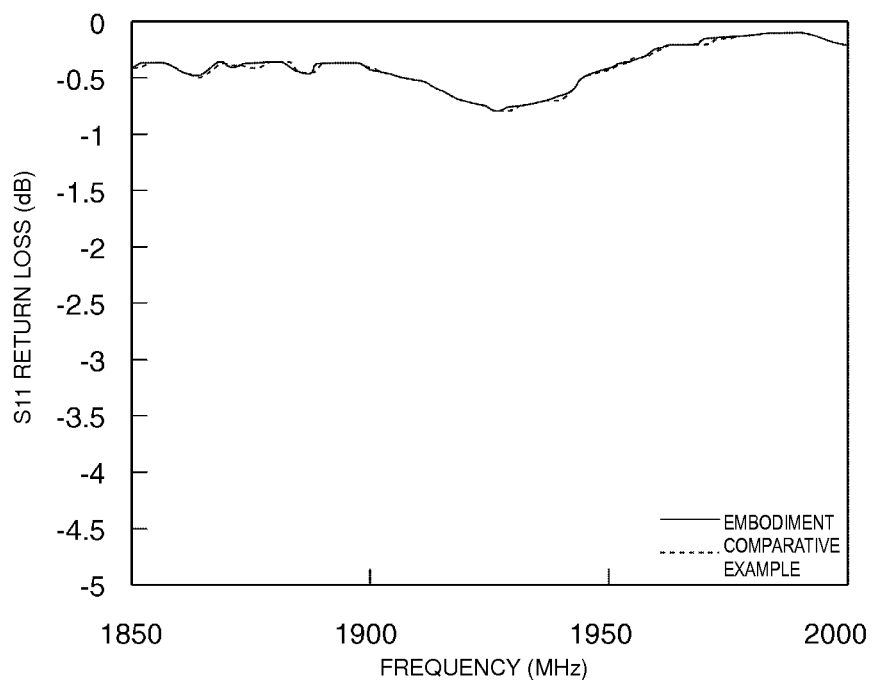
FIG. 6 is a diagram illustrating S11 return loss characteristics of the elastic wave resonators of the first preferred embodiment of the present invention and the comparative example.

In addition, the resonance characteristics of the present preferred embodiment and the comparative example of the above-mentioned surface acoustic wave resonators were measured. The results are illustrated in FIG. 3 to FIG. 6. FIG. 3 illustrates impedance frequency characteristics, FIG. 4 illustrates phase characteristics, FIG. 5 illustrates impedance Smith charts, and FIG. 6 illustrates S11 return loss characteristics. In FIG. 3 to FIG. 6, solid lines indicate the results of the present preferred embodiment, and dashed lines indicate the results of the comparative example.

As is clear from FIG. 3 to FIG. 6, no change in a resonance-antiresonance characteristic is seen in the present preferred embodiment and the comparative example. Accordingly, it is understood that, in the present preferred embodiment, it is possible to improve the heat dissipation property without the design change of the resonator.

Therefore, according to the present preferred embodiment, as is clear from comparison between the above-mentioned non-limiting example of the present preferred embodiment and the comparative example, it is understood that, by providing the first and second heat dissipation electrodes 8 and 9, it is possible to effectively enhance the heat dissipation property. Accordingly, it is possible to significantly reduce and prevent a change in a resonance characteristic at the time of implementation. Accordingly, it is possible to provide a surface acoustic wave resonator having a stable resonance characteristic.

In addition, while, in FIG. 1A, the number of portions in which an apodization local maximum value occurs preferably is two, the IDT electrode may be subjected to weighting so that more than two apodization local maximum values occur. In that case, while a plurality of apodization local minimum value portions occur, preferably, it is desirable that the same heat dissipation electrode as the above-mentioned preferred embodiment is provided in each of the plural apodization local minimum value portions. However, it is only necessary for the above-mentioned heat dissipation electrode to be provided in at least one of the plural apodization local minimum value portions, and it is not necessary for the heat dissipation electrode to be provided in every apodization local minimum value portion.

In addition, while, in the above-mentioned preferred embodiment, as the elastic wave resonator, the elastic wave resonator utilizing the surface acoustic wave has been described as a non-limiting example, the present invention may also be applied to a boundary acoustic wave resonator utilizing a boundary acoustic wave.

Figure 7:
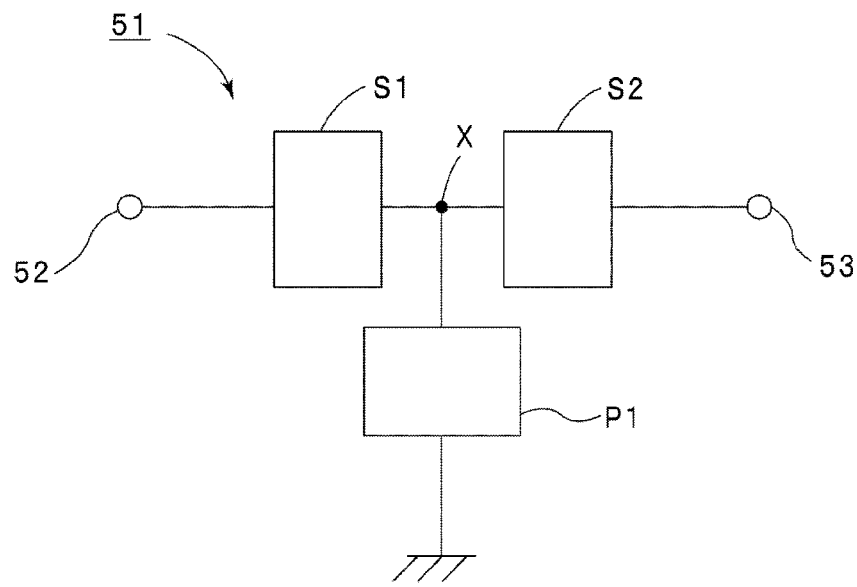
FIG. 7 is a circuit diagram schematically illustrating a circuit configuration of a ladder filter according to another preferred embodiment of the present invention.

FIG. 7 is a circuit diagram illustrating an example of a ladder filter to which the present invention is applied. In a ladder filter 51, series arm resonators S1 and S2 are connected in series to each other between an input terminal 52 and an output terminal 53. Owing to the series arm resonators S1 and S2, a series arm is configured. A parallel arm resonator P1 is connected between a connection point X between the series arm resonators S1 and S2 and a ground potential. Owing to the parallel arm resonator P1, a parallel arm is configured.

By utilizing the elastic wave resonator 1 of the above-mentioned preferred embodiment as at least one of the series arm resonators S1 and S2 and the parallel arm resonator P1, it is possible to configure the ladder filter 51 of the present preferred embodiment. In this case, since, in the elastic wave resonator 1 of the above-mentioned preferred embodiment, the heat dissipation property is enhanced, and the resonance characteristic becomes stabilized, it is possible to achieve the stabilization of the filter characteristics of the ladder filter 51.

In addition, the ladder filter of preferred embodiments of the present invention is not limited to a ladder filter having the circuit configuration illustrated in FIG. 7. The present invention may be applied to a ladder filter including series arm resonators and parallel arm resonators whose numbers are arbitrary, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave resonator comprising:
    a piezoelectric substrate; and
    an IDT electrode located on the piezoelectric substrate and apodization-weighted so that a plurality of local maximum values in apodization occur in an elastic wave propagation direction; and
    a heat dissipation electrode provided in at least a portion of one apodization local minimum value from among portions of one or more apodization local minimum values that occur in the elastic wave propagation direction and are sandwiched between portions of the plural apodization local maximum values occurring, in the IDT electrode; wherein
    assuming that a direction dimension width of the heat dissipation electrode in the elastic wave propagation direction is A and a dimension of about ½ of a wave length of a propagating elastic wave is B, B<A is satisfied.

2. The elastic wave resonator according to claim 1, wherein the heat dissipation electrode is provided in each of the one or more apodization local minimum value portions.

3. The elastic wave resonator according to claim 1, wherein the heat dissipation electrode extends in a direction perpendicular or substantially perpendicular to an elastic wave propagation direction and includes first and second heat dissipation electrodes facing each other across a gap in a direction perpendicular or substantially perpendicular to the elastic wave propagation direction.

4. The elastic wave resonator according to claim 3, wherein lengths of the first and second heat dissipation electrodes are equal to each other.

5. The elastic wave resonator according to claim 3, wherein lengths of the first and second heat dissipation electrodes are different from each other.

6. The elastic wave resonator according to claim 1, wherein an area of the heat dissipation electrode is larger than an area of a remaining electrode finger.

7. The elastic wave resonator according to claim 1, wherein the IDT electrode includes a pair of busbars, and one of the busbars of the IDT electrode is integrated with reflectors disposed on both sides of the IDT electrode in the elastic wave propagation direction.

8. A ladder filter comprising:
    a series arm resonator and a parallel arm resonator including elastic wave resonators; wherein
    at least one of the elastic wave resonators included in the series arm resonator and the parallel arm resonator includes the elastic wave resonator according to claim 1.

* * * * *